(12) United States Patent
Chen

(10) Patent No.: US 6,179,449 B1
(45) Date of Patent: Jan. 30, 2001

(54) MULTI-COLOR SEMICONDUCTOR LAMP AND METHOD OF PROVIDING COLORED ILLUMINATION

(76) Inventor: I-Ming Chen, 4F, No. 52, Sec. 2, Chung-Shan N. Rd., Taipei-City (TW)

( * ) Notice: Under 35 U.S.C. 154(b), the term of this patent shall be extended for 0 days.

(21) Appl. No.: 09/339,396

(22) Filed: Jun. 23, 1999

(51) Int. Cl.[7] .................................................. F21U 9/00
(52) U.S. Cl. .................... 362/293; 362/285; 362/339; 362/326; 362/800; 362/230; 313/501; 313/512
(58) Field of Search .................... 362/230, 231, 362/326, 331, 268, 293, 800, 285, 339; 313/501, 512; 359/567, 558

(56) References Cited

U.S. PATENT DOCUMENTS

| | | | |
|---|---|---|---|
| 3,805,347 | * 4/1974 | Collins | 313/108 |
| 3,875,456 | 4/1975 | Kano et al. | 313/501 |
| 3,890,170 | 6/1975 | Russ | 438/35 |
| 4,013,915 | * 3/1977 | Dufft | 313/499 |
| 4,996,566 | * 2/1991 | Morita et al. | 355/246 |
| 5,077,588 | 12/1991 | Yamada et al. | 257/96 |
| 5,491,349 | 2/1996 | Komoto et al. | 257/88 |
| 5,585,648 | 12/1996 | Tischler | 257/77 |
| 5,684,309 | 11/1997 | McIntosh et al. | 257/191 |
| 5,743,629 | 4/1998 | Helstern et al. | 362/293 |
| 5,752,766 | 5/1998 | Bailey et al. | 362/250 |
| 5,803,579 | * 9/1998 | Turnabull et al. | 362/293 |
| 5,812,105 | 9/1998 | Van de Ven | 345/83 |

* cited by examiner

*Primary Examiner*—Sandra O'Shea
*Assistant Examiner*—Ali Alavi
(74) *Attorney, Agent, or Firm*—Christensen O'Connor; Johnson Kindness PLLC

(57) ABSTRACT

A multi-color semiconductor lamp includes a semiconductor light source activable so as to generate a light output, a dispersing prism and a lens. The prism has an input side located in front of the light source to receive the light output, and an output side, and separates the light output of the light source into a plurality of chromatic components that radiate at different angles at the output side. The lens is disposed in front of the output side of the prism such that a vertex of a conical focusing region associated with the lens is located at the output side of the prism. The light source is activated when the spatial position of one of the light source and the prism relative to the other one of the light source and the prism has been varied such that a selected one of the chromatic components is registered with the conical focusing region of the lens. The semiconductor lamp can thus be controlled so as to generate different colored light outputs.

43 Claims, 5 Drawing Sheets

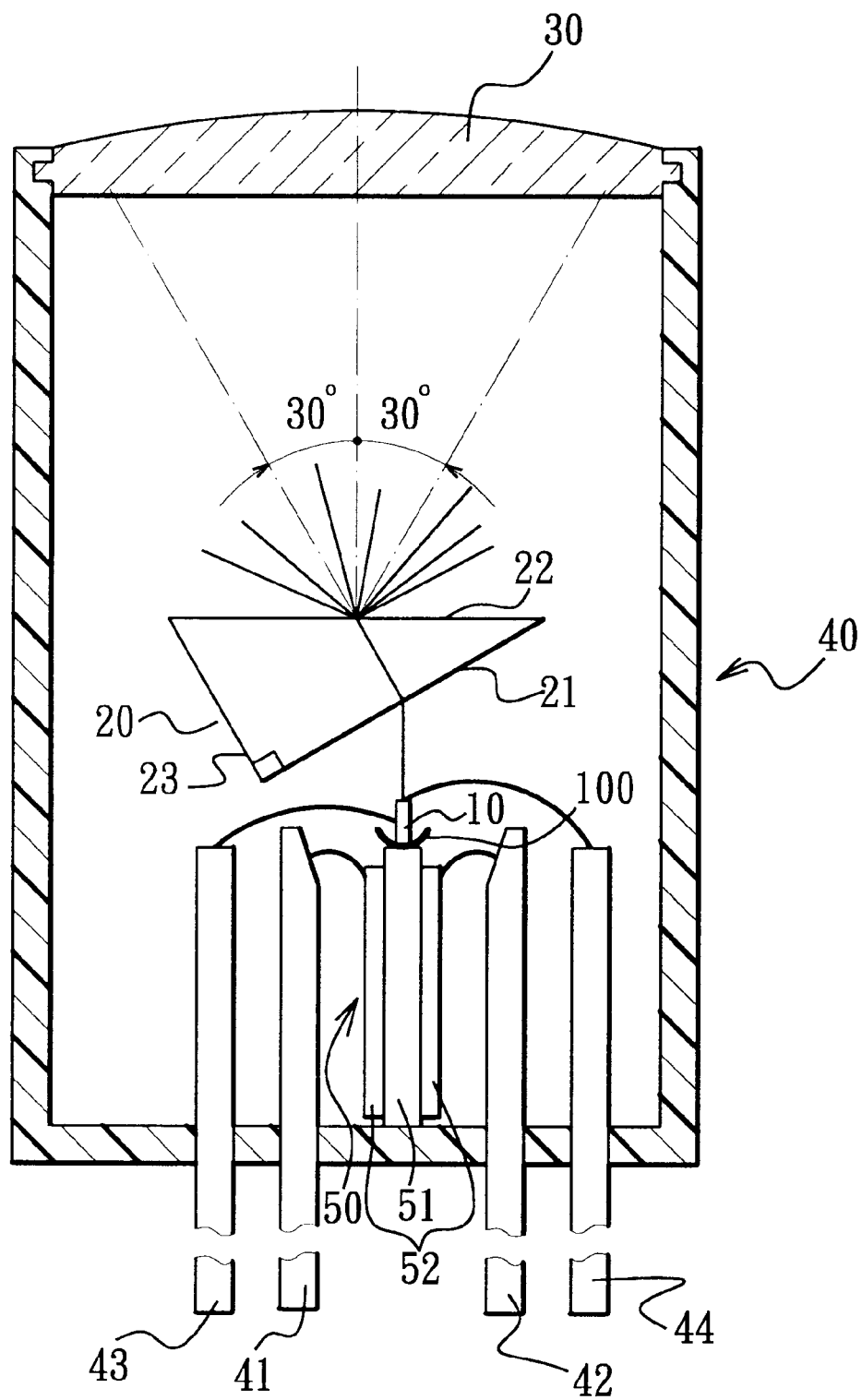
F I G. 1

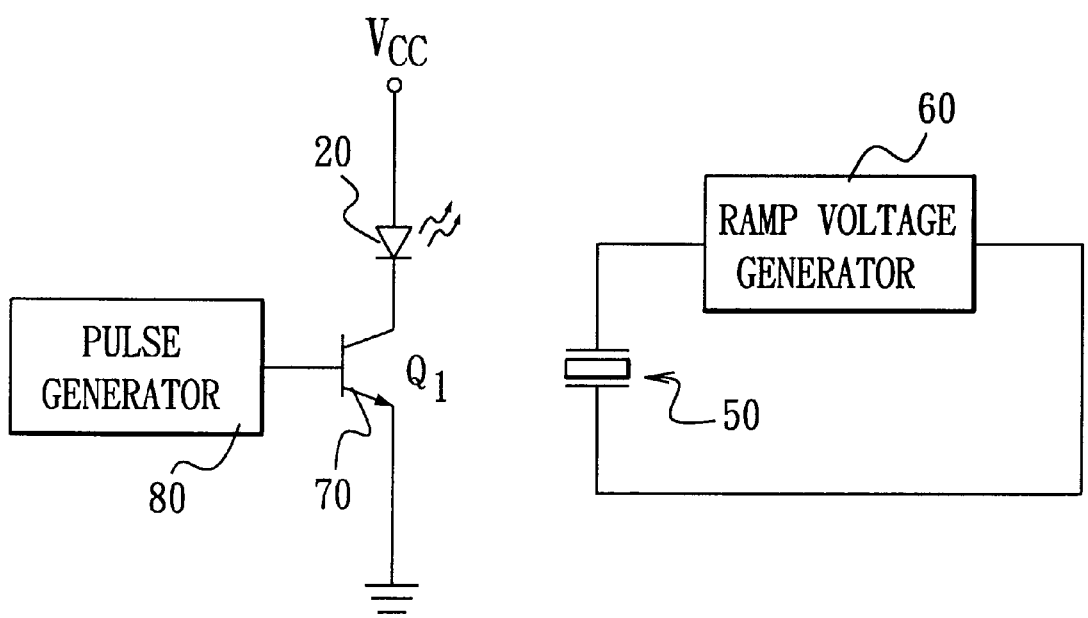
F I G. 2

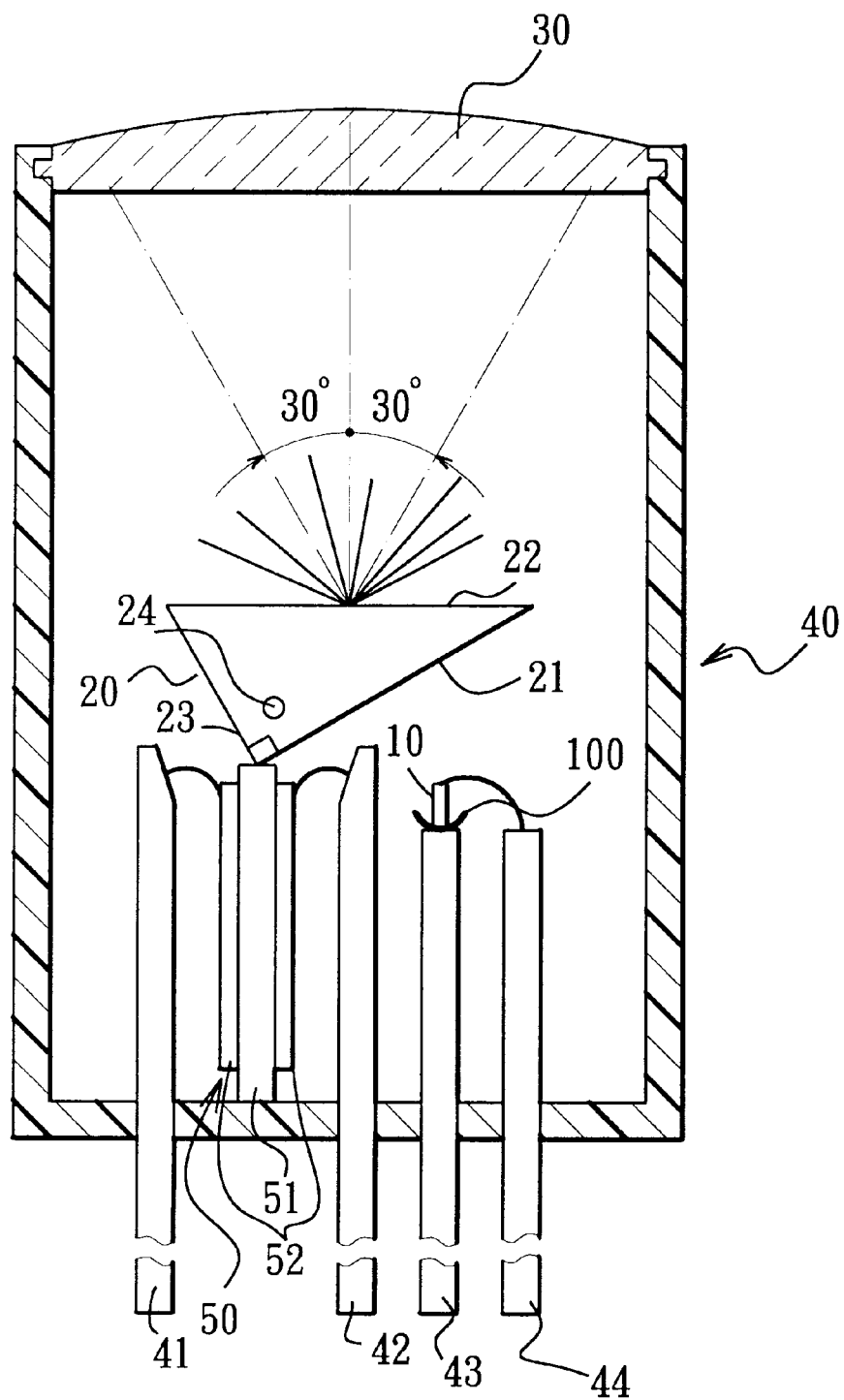
F I G. 4

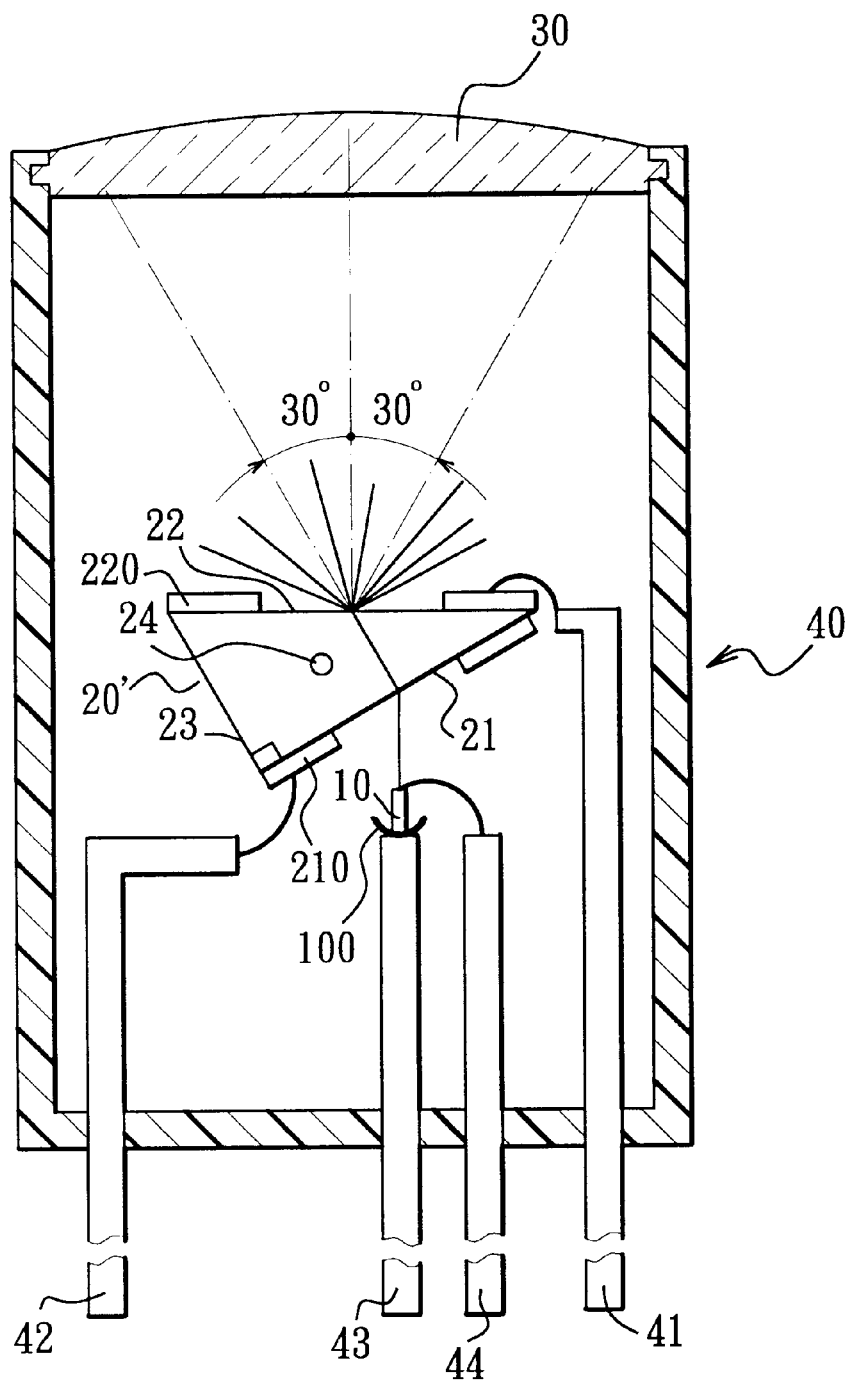
F I G. 5

MULTI-COLOR SEMICONDUCTOR LAMP AND METHOD OF PROVIDING COLORED ILLUMINATION

BACKGROUND OF THE INVENTION

1. Field of the Invention

The invention relates to a semiconductor lamp, more particularly to a multi-color semiconductor lamp and to a method of providing colored illumination.

2. Description of the Related Art

Semiconductor devices that are capable of generating different colored light outputs are known in the art. Examples of such semiconductor devices of the prior art are those disclosed in the following U.S. patents:

U.S. Pat. Nos. 3,875,456, 3,890,170, 5,491,349, 5,752,766 and 5,812,105 disclose various forms of semiconductor devices that comprise a plurality of light emitting diodes disposed close to one another and respectively emitting light of different colors. The light emitting diodes can be individually controlled to operate solely or in combination, thereby resulting in different colored light outputs. It is noted that the semiconductor devices disclosed in these patents require a relatively complicated control circuit for controlling the differently colored light emitting diodes individually in order to generate a wide range of different colored light outputs.

Semiconductor devices that are capable of generating light outputs of multiple wavelengths are also known in the art. Examples of such semiconductor devices of the prior art are those disclosed in the following U.S. patents:

U.S. Pat. No. 5,077,588 discloses a semiconductor device operable to emit an infrared light and a visible light. U.S. Pat. No. 5,585,648 discloses a semiconductor device capable of emitting light in the green to ultraviolet spectrum. While the light outputs of the semiconductor devices disclosed in these patents are of multiple wavelengths, they are insufficient to generate a wide range of different colored light outputs.

In addition, semiconductor devices that are capable of generating white light are also known in the art. Examples of such semiconductor devices of the prior art are those disclosed in the following U.S. patents:

U.S. Pat. No. 5,684,309 discloses a light emitting diode that includes stacked active layers of indium gallium nitride separated by barrier layers of aluminum gallium nitride or aluminum indium gallium nitride. U.S. Pat. No. 5,743,629 discloses an illumination system in which nonwhite light from a light emitting diode is reflected by a reflector to obtain white light. While the devices disclosed in these patents can be designed to generate light of a particular color, they are not designed for providing multi-color illumination.

SUMMARY OF THE INVENTION

Therefore, the main object of the present invention is to provide a multi-color semiconductor lamp that employs a single semiconductor light source to generate a wide range of different colored light outputs, and to a method of providing colored illumination.

According to one aspect of the invention, a multi-color semiconductor lamp comprises:

a semiconductor light source activable so as to generate a light output;

a dispersing prism having an input side located in front of the light source to receive the light output, and an output side, the prism separating the light output of the light source into a plurality of chromatic components that radiate at different angles at the output side;

a lens disposed in front of the output side of the prism such that a vertex of a conical focusing region associated with the lens is located at the output side of the prism;

means for varying spatial position of one of the light source and the prism relative to the other one of the light source and the prism; and means for activating the light source when the spatial position of said one of the light source and the prism has been varied such that a selected one of the chromatic components is registered with the conical focusing region of the lens.

According to another aspect of the invention, a method of providing colored illumination comprises:

providing a dispersing prism between a semiconductor light source and a lens, the prism having an input side located in front of the light source to receive a light output therefrom, and being capable of separating the light output into a plurality of chromatic components that radiate at different angles at an output side of the prism, the lens being disposed in front of the output side of the prism such that a vertex of a conical focusing region associated with the lens is located at the output side of the prism;

varying spatial position one of the light source and the prism relative to the other one of the light source and the prism; and activating the light source when the spatial position of said one of the light source and the prism has been varied such that a selected one of the chromatic components is registered with the conical focusing region of the lens.

BRIEF DESCRIPTION OF THE DRAWINGS

Other features and advantages of the present invention will become apparent in the following detailed description of the preferred embodiments with reference to the accompanying drawings, of which:

FIG. 1 is a partly sectional schematic view illustrating the first preferred embodiment of a multi-color semiconductor lamp according to the present invention;

FIG. 2 is a schematic circuit block diagram of the multi-color semiconductor lamp according to the present invention;

FIG. 4 is a partly sectional schematic view of the second preferred embodiment of a multi-color semiconductor lamp according to the present invention; and FIG. 5 is a partly sectional schematic view of the third preferred embodiment of a multi-color semiconductor lamp according to the present invention.

DETAILED DESCRIPTION OF THE PREFERRED EMBODIMENTS

Figures 3A, 3B, 3C, 3D, 3E, 3F, 3G, 3H:
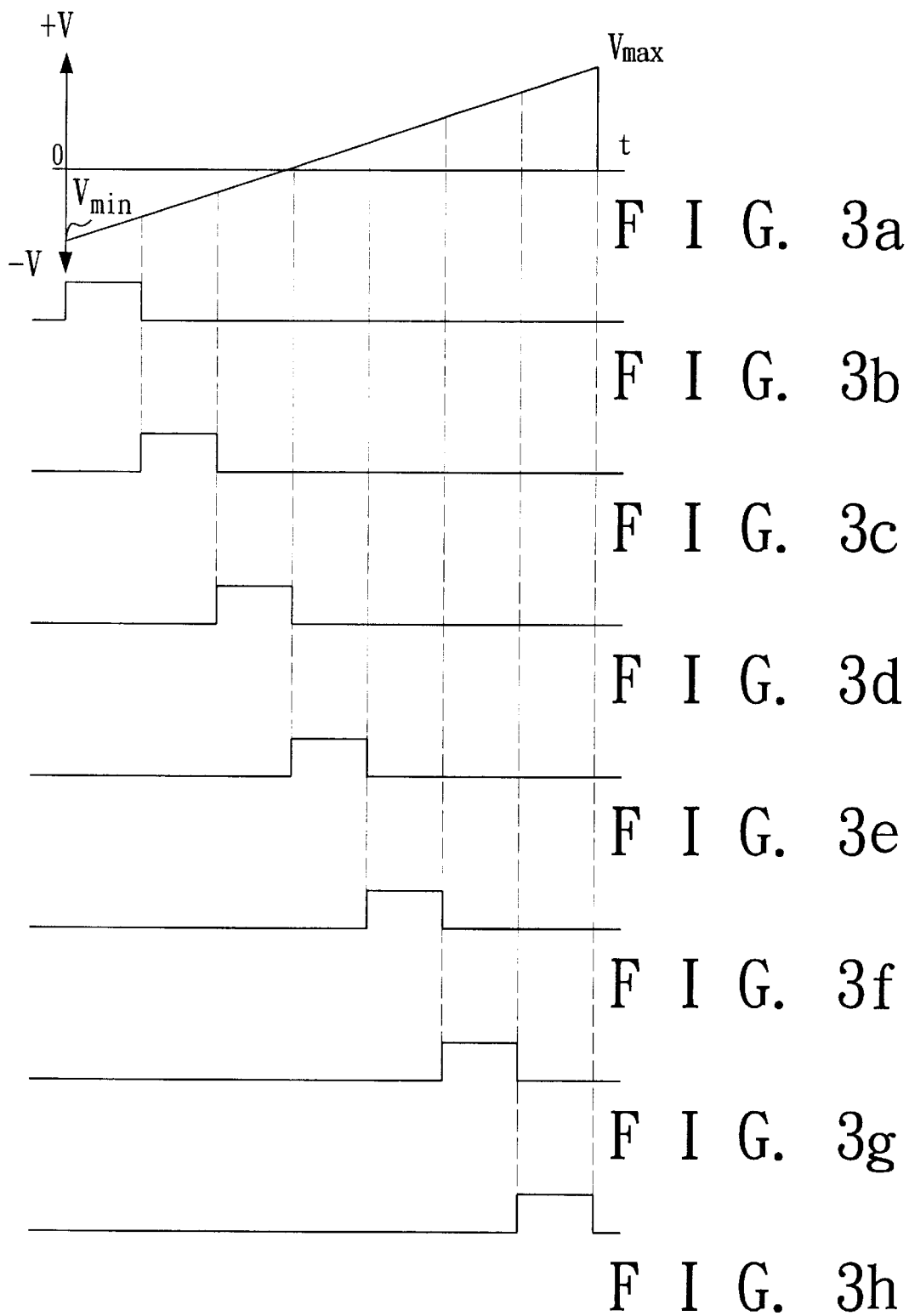
FIGS. 3a to 3h are timing diagrams illustrating the relationship between a ramp voltage output of a ramp voltage generator and different pulses from a pulse generator according to present invention.

Before the present invention is described in greater detail, it should be noted that like elements are denoted by the same reference numerals throughout the disclosure.

Referring to FIG. 1, the first preferred embodiment of a multi-color semiconductor lamp according to the present invention is shown to comprise a semiconductor light source 10, a dispersing prism 20, a fixed lens 30 and a lamp housing 40.

In this embodiment, the semiconductor light source 10 is a light emitting diode or a laser diode that generates a light output when activated.

The prism 20 is formed from a transparent material having a light refracting capability and selected from the group consisting of crystals, glass and plastic. The prism 20 has an input side 21 located in front of the light source 10 to receive the light output, an output side 22, and a base 23. The input side 21 forms a right angle with the base 23. The prism 20 separates the light output of the light source 10 into a plurality of chromatic components that radiate at different angles at the output side 22.

Preferably, the light source 10 generates white light when activated such that up to seven primary (i.e. red, green and blue) and secondary (i.e. orange, yellow, purple and violet) chromatic components can be radiated at the output side 22.

The lens 30, which has a convex light output side, is disposed in front of the output side 22 of the prism 20 such that a vertex of a conical focusing region associated with the lens 30 is located at the output side 22 of the prism 20. The conical focusing region has borders that form a 30° angle with an optical axis of the lens 30.

The light source 10, the prism 20 and the lens 30 are mounted in the lamp housing 40. Two terminals 43, 44 extend outwardly of the lamp housing 40 and are connected to voltage nodes of the light source 10.

In the first preferred embodiment, the spatial position of the light source 10 relative to the prism 20 can be varied. To this end, the light source 10 is seated on a reflective base 100 that is mounted on one end of an elongated piezoelectric member 50 such that the former is movable relative to the prism 20. The other end of the piezoelectric member 50 is mounted on the lamp housing 40. The piezoelectric member 50 includes a ceramic substrate 51 and two electrodes 52 that sandwich the ceramic substrate 51.

Referring to FIGS. 1 and 2, the electrodes 52 of the piezoelectric member 50 are connected electrically to two terminals 41, 42 that extend outwardly of the lamp housing 40 for connection to a ramp voltage generator 60. The ramp voltage generator 60 applies a bipolar periodic ramp voltage output (see FIG. 3*a*) to the electrodes 52, thereby enabling the piezoelectric member 50 to deform in response to the magnitude of the ramp voltage output and vary an incident angle of the light output of the light source 10 at the input side 21 of the prism 20.

An experiment was conducted to verify the effect of varying the spatial position of the light source 10 relative to the prism 20 on the radiating angles of the chromatic components at the output side 22 of the prism 20. The light source 10 is one that generates a white light output having a first chromatic component with a wavelength of 652.272 and associated with the color red (wavelength of red is in the range of 622–780 nm), a second chromatic component with a wavelength of 589.262 and associated with the color yellow (wavelength of yellow is in the range of 577–597 nm), a third chromatic component with a wavelength of 546.074 and associated with the color green (wavelength of green is in the range of 492–577 nm), a fourth chromatic component with a wavelength of 486.133 and associated with the color blue (wavelength of blue is in the range of 455–492 nm), and a fifth chromatic component with a wavelength of 435.835 and associated with the color violet (wavelength of violet is in the range of 390–455 nm). The prism 20 is a glass prism having a prism angle (the angle formed between the input side and the base) of 90°, and the following indices of refraction: 1.456372 for the red chromatic component, 1.458407 for the yellow chromatic component, 1.460079 for the green chromatic component, 1.463131 for the blue chromatic component, and 1.466694 for the violet chromatic component. Tables I to III illustrate the refracting angles and the radiating angles for the different chromatic components under incident angles of 47.02°, 480° and 49°, respectively.

TABLE I

| Wavelength(nm) | Refraction Angle | Radiating Angle |
|---|---|---|
| 656.272 | 30.15483459 | 83.15463919 |
| 589.262 | 30.10839893 | 83.8574767 |
| 546.074 | 30.07035952 | 84.50148278 |
| 486.133 | 30.00118559 | 85.9310302 |
| 435.835 | 29.92085454 | 89.22452406 |

TABLE II

| Wavelength(nm) | Refraction Angle | Radiating Angle |
|---|---|---|
| 656.272 | 30.68190221 | 77.03392277 |
| 589.262 | 30.63447827 | 77.38634892 |
| 546.074 | 30.59563 | 77.68332837 |
| 486.133 | 30.52498681 | 78.24444754 |
| 435.835 | 30.44295217 | 78.93492826 |

TABLE III

| Wavelength(nm) | Refraction Angle | Radiating Angle |
|---|---|---|
| 656.272 | 31.21239837 | 72.8363937 |
| 589.262 | 31.16396881 | 73.09753575 |
| 546.074 | 31.12429751 | 73.31506349 |
| 486.133 | 31.05215946 | 73.71940698 |
| 435.835 | 30.96839171 | 74.20417713 |

From the data shown in Tables I to III, it is apparent that, as is known in the art, different wavelengths of light are radiated at different angles by the prism 20. In addition, by varying the incident angle of the light output of the light source 10, the chromatic components of the light output can be registered selectively with the conical focusing region of the lens 30. As such, in the multi-color semiconductor lamp of this invention, the color of the light radiated from the lens 30 can thus be perceived by the human eye to be dominated by the chromatic component that is registered with the conical focusing region of the lens 30.

In order to enable the semiconductor lamp to generate different colored light outputs, the light source 10 is activated only when the spatial position thereof relative to the prism 20 has been varied such that the selected one of the chromatic components is registered with the conical focusing region of the lens 30. To this end, a switching circuit 70, in the form of a switching transistor (Q1), is employed to interconnect one of the terminals 43, 44 and the ground. The other one of the terminals 43, 44 is connected to an external voltage source (Vcc). A pulse generator 80 is connected electrically to a control input of the switching circuit 70, i.e. the base terminal of the switching transistor (Q1), and is operable so as to generate a pulse within a predetermined fraction of a time period of the ramp voltage output from the ramp voltage generator 60. Referring to FIG. 3*a*, the time period of the ramp voltage output is a duration for transition from a minimum value (Vmin), e.g. −1.5 volts, to a maximum value (Vmax), e.g. +1.5 volts. The pulse from the pulse generator 80 is provided to the control input of the switching circuit 70 so as to enable the switching circuit 70 to activate the light source 10 at an instant when the spatial position of the light source 10 has been varied such that the selected one of the chromatic components is registered with the conical focusing region of the lens 30. Therefore, in the event that the light output of the light source 10 has seven chromatic components, i.e. violet, purple, blue, green, yellow, orange and red, the pulse generator 80 can be controlled so as to generate a selected one of seven different pulses, shown in FIGS. 3b to 3h, that occur at different predetermined fractions of the time period of the ramp voltage output of the ramp voltage generator 60 and that correspond respectively to the different chromatic components of the light output of the light source 10, thereby enabling the semiconductor lamp to generate different colored light outputs.

Preferably, the periodic ramp voltage output of the ramp voltage generator 60 is at least 16 Hz, which is sufficient to enable the human eye to perceive an uninterrupted light output from the semiconductor lamp of this invention. In addition, the chromatic components can be combined to generate a wider range of colored light outputs. This can be accomplished by registering different chromatic components of the light output of the light source 10 with the conical focusing region of the lens 30 within the same period of the ramp voltage output of the ramp voltage generator 60, or during consecutive periods of the ramp voltage output, thereby allowing the human eye to perceive a colored light output that is a combination of the chromatic components that were registered consecutively with the conical focusing region of the lens 30.

FIG. 4 illustrates the second preferred embodiment of a multi-color semiconductor lamp according to the present invention. Unlike the previous embodiment, it is the prism 20 that is movable relative to the light source 10. Particularly, the prism 20 is pivoted to the lamp housing 40 about a pivot 24, and is mounted on one end of the piezoelectric member 50. The light source 10 is seated on a reflective base 100 that is mounted on one of the terminals 43, 44 on the lamp housing 40. When the ramp voltage generator 60 (see FIG. 2) applies the bipolar periodic ramp voltage output (see FIG. 3a) to the electrodes 52 of the piezoelectric member 50 via the terminals 41, 42 on the lamp housing 40, the piezoelectric member 50 deforms in response to the magnitude of the ramp voltage output to vary the spatial position of the prism 20 relative to the light source 10. That is to say, the prism 20 pivots about the pivot 24 to vary the angular orientation of the input and output sides 21, 22 of the prism 20 relative to the light source 10 and the lens 30, respectively. With reference to FIG. 2, by controlling the pulse generator 80 to provide a pulse to the switching circuit 70 within a predetermined fraction of the time period of the ramp voltage output from the ramp voltage generator 60, the switching circuit 70 can be enabled so as to activate the light source 10 at an instant when the spatial position of the prism 20 has been varied such that the selected one of the chromatic components is registered with the conical focusing region of the lens 30.

FIG. 5 illustrates the third preferred embodiment of a multi-color semiconductor lamp according to the present invention. Unlike the previous embodiments, no elongated piezoelectric member is in use. Instead, the prism 20' is a transparent piezoelectric crystal prism having a light refracting capability. The prism 20' is supported in the lamp housing 40 by a pivot 24. The prism 20' is provided with a pair of electrodes 210, 220 at the input and output sides 21, 22 of the same, respectively. The electrodes 210, 220 are connected to the terminals 41, 42 on the lamp housing 40, respectively. The light source 10 is seated on a reflective base 100 that is mounted on one of the terminals 43, 44 on the lamp housing 40. When the ramp voltage generator 60 (see FIG. 2) applies the bipolar periodic ramp voltage output (see FIG. 3a) to the electrodes 210, 220 via the terminals 41, 42 on the lamp housing 40, the prism 20' deforms in response to the magnitude of the ramp voltage output to vary the spatial position of the prism 20' relative to the light source 10. That is, the angular orientation of the input and output sides 21, 22 of the prism 20' relative to the respective one of the light source 10 and the lens 30 is varied, and the radiating angles of the chromatic components at the output side 22 of the prism 20' are varied as well. With reference to FIG. 2, by controlling the pulse generator 80 to provide a pulse to the switching circuit 70 within a predetermined fraction of the time period of the ramp voltage output from the ramp voltage generator 60, the switching circuit 70 can be enabled so as to activate the light source 10 at an instant when the spatial position of the prism 20' has been varied such that the selected one of the chromatic components is registered with the conical focusing region of the lens 30.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A multi-color semiconductor lamp, comprising:

a semiconductor light source activable so as to generate a light output;

a dispersing prism having an input side located in front of said light source to receive the light output, and an output side, said prism separating the light output of said light source into a plurality of chromatic components that radiate at different angles at said output side;

a lens disposed in front of said output side of said prism such that a vertex of a conical focusing region associated with said lens is located at said output side of said prism;

means for varying spatial position of one of said light source and said prism relative to the other one of said light source and said prism; and means for activating said light source when the spatial position of said one of said light source and said prism has been varied such that a selected one of the chromatic components is registered with the conical focusing region of said lens.

2. The multi-color semiconductor lamp as claimed in claim 1, wherein said position varying means comprises:

an elongated piezoelectric member having one end with said light source mounted thereon such that said light source is movable relative to said prism; and ramp voltage generator means connected electrically to said piezoelectric member and applying a periodic ramp voltage output thereto;

said piezoelectric member deforming in response to magnitude of the ramp voltage output to permit varying of an incident angle of the light output of said light source at said input side of said prism.

3. The multi-color semiconductor lamp as claimed in claim 2, wherein said piezoelectric member includes a ceramic substrate and two electrodes that sandwich said ceramic substrate and that are connected electrically to said ramp voltage generator means.

4. The multi-color semiconductor lamp as claimed in claim 2, wherein the ramp voltage output is bipolar.

5. The multi-color semiconductor lamp as claimed in claim 2, wherein said activating means comprises:
   a switching circuit adapted to make connection between said light source and an external voltage source; and
   pulse generating means connected electrically to said switching circuit and operable so as to generate a pulse within a predetermined fraction of a time period of the ramp voltage output, the time period of the ramp voltage output being a duration for transition from a minimum value to a maximum value, the pulse being provided to said switching circuit so as to enable said switching circuit to activate said light source at an instant when the spatial position of said light source has been varied such that the selected one of the chromatic components is registered with the conical focusing region of said lens.

6. The multi-color semiconductor lamp as claimed in claim 2, wherein the periodic ramp voltage output has a frequency of at least 16 Hz.

7. The multi-color semiconductor lamp as claimed in claim 1, wherein said position varying means comprises:
   an elongated piezoelectric member having one end with said prism mounted thereon such that said prism is movable relative to said light source; and
   ramp voltage generator means connected electrically to said piezoelectric member and applying a ramp voltage output thereto;
   said piezoelectric member deforming in response to magnitude of the ramp voltage output to vary the spatial position of said prism relative to said light source.

8. The multi-color semiconductor lamp as claimed in claim 7, wherein said piezoelectric member includes a ceramic substrate and two electrodes that sandwich said ceramic substrate and that are connected electrically to said ramp voltage generator means.

9. The multi-color semiconductor lamp as claimed in claim 7, wherein the ramp voltage output is bipolar.

10. The multi-color semiconductor lamp as claimed in claim 7, wherein said activating means comprises:
    a switching circuit adapted to make connection between said light source and an external voltage source; and
    pulse generating means connected electrically to said switching circuit and operable so as to generate a pulse within a predetermined fraction of a time period of the ramp voltage output, the time period of the ramp voltage output being a duration for transition from a minimum value to a maximum value, the pulse being provided to said switching circuit so as to enable said switching circuit to activate said light source at an instant when the spatial position of said prism has been varied such that the selected one of the chromatic components is registered with the conical focusing region of said lens.

11. The multi-color semiconductor lamp as claimed in claim 7, wherein the periodic ramp voltage output has a frequency of at least 16 Hz.

12. The multi-color semiconductor lamp as claimed in claim 1, wherein said prism is formed from a transparent material having a light refracting capability and selected from the group consisting of crystals, glass and plastic.

13. The multi-color semiconductor lamp as claimed in claim 1, wherein said prism is a transparent piezoelectric crystal prism having a light refracting capability.

14. The multi-color semiconductor lamp as claimed in claim 13, wherein said prism is provided with a pair of electrodes, said position varying means including ramp voltage generator means connected electrically to said electrodes of said prism and applying a periodic ramp voltage output thereto, said prism deforming in response to magnitude of the ramp voltage output to vary the spatial positions of said input and output sides of said prism relative to said light source and said lens and vary radiating angles of the chromatic components at said output side of said prism.

15. The multi-color semiconductor lamp as claimed in claim 14, wherein said electrodes are provided at said input and output sides of said prism, respectively.

16. The multi-color semiconductor lamp as claimed in claim 14, wherein the ramp voltage output is bipolar.

17. The multi-color semiconductor lamp as claimed in claim 14, wherein said activating means comprises:
    a switching circuit adapted to make connection between said light source and an external voltage source; and
    pulse generating means connected electrically to said switching circuit and operable so as to generate a pulse within a predetermined fraction of a time period of the ramp voltage output, the time period of the ramp voltage output being a duration for transition from a minimum value to a maximum value, the pulse being provided to said switching circuit so as to enable said switching circuit to activate said light source at an instant when the spatial position of said prism has been varied such that the selected one of the chromatic components is registered with the conical focusing region of said lens.

18. The multi-color semiconductor lamp as claimed in claim 14, wherein the periodic ramp voltage output has a frequency of at least 16 Hz.

19. The multi-color semiconductor lamp as claimed in claim 1, wherein said light source is a light emitting diode.

20. The multi-color semiconductor lamp as claimed in claim 1, wherein said light source is a laser diode.

21. The multi-color semiconductor lamp as claimed in claim 1, wherein said prism further has a base, said input side of said prism forming a right angle with said base.

22. The multi-color semiconductor lamp as claimed in claim 1, further comprising a lamp housing having said light source, said prism and said lens mounted therein.

23. A method of providing colored illumination, comprising:
    providing a dispersing prism between a semiconductor light source and a lens, the prism having an input side located in front of the light source to receive a light output therefrom, the prism being capable of separating the light output into a plurality of chromatic components that radiate at different angles at an output side of the prism, the lens being disposed in front of the output side of the prism such that a vertex of a conical focusing region associated with the lens is located at the output side of the prism;
    varying spatial position of one of the light source and the prism relative to the other one of the light source and the prism; and
    activating the light source when the spatial position of said one of the light source and the prism has been varied such that a selected one of the chromatic components is registered with the conical focusing region of the lens.

24. The method as claimed in claim 23, wherein the position varying step comprises:

mounting the light source on one end of an elongated piezoelectric member such that the light source is movable relative to the prism; and applying a periodic ramp voltage output to the piezoelectric member so as to deform the piezoelectric member in response to magnitude of the ramp voltage output and vary an incident angle of the light output of the light source at the input side of the prism.

25. The method as claimed in claim 24, wherein the piezoelectric member includes a ceramic substrate and two electrodes that sandwich the ceramic substrate.

26. The method as claimed in claim 24, wherein the ramp voltage output is bipolar.

27. The method as claimed in claim 24, wherein the activating step comprises:

generating a pulse within a predetermined fraction of a time period of the ramp voltage output, the time period of the ramp voltage output being a duration for transition from a minimum value to a maximum value; and providing the pulse to a switching circuit that is capable of making connection between the light source and an external voltage source so as to enable the switching circuit to activate the light source at an instant when the spatial position of the light source has been varied such that the selected one of the chromatic components is registered with the conical focusing region of the lens.

28. The method as claimed in claim 24, wherein the periodic ramp voltage output has a frequency of at least 16 Hz.

29. The method as claimed in claim 23, wherein the position varying step comprises:

mounting the prism on one end of an elongated piezoelectric member such that the prism is movable relative to the light source; and applying a ramp voltage output to the piezoelectric member so as to deform the piezoelectric member in response to magnitude of the ramp voltage output and vary the spatial position of the prism relative to the light source.

30. The method as claimed in claim 29, wherein the piezoelectric member includes a ceramic substrate and two electrodes that sandwich the ceramic substrate.

31. The method as claimed in claim 29, wherein the ramp voltage output is bipolar.

32. The method as claimed in claim 29, wherein the activating step comprises:

generating a pulse within a predetermined fraction of a time period of the ramp voltage output, the time period of the ramp voltage output being a duration for transition from a minimum value to a maximum value; and providing the pulse to a switching circuit that is capable of making connection between the light source and an external voltage source so as to enable the switching circuit to activate the light source at an instant when the spatial position of the prism has been varied such that the selected one of the chromatic components is registered with the conical focusing region of the lens.

33. The method as claimed in claim 29, wherein the periodic ramp voltage output has a frequency of at least 16 Hz.

34. The method as claimed in claim 23, wherein the prism is formed from a transparent material having a light refracting capability and selected from the group consisting of crystals, glass and plastic.

35. The method as claimed in claim 23, wherein the prism is a transparent piezoelectric crystal prism having a light refracting capability.

36. The method as claimed in claim 35, wherein the prism is provided with a pair of electrodes, the position varying step including applying a ramp voltage output to the electrodes of the prism so as to deform the prism in response to magnitude of the ramp voltage output to vary the spatial positions of the input and output sides of the prism relative to the light source and the lens and vary radiating angles of the chromatic components at the output side of the prism.

37. The method as claimed in claim 36, wherein the ramp voltage output is bipolar.

38. The method as claimed in claim 36, wherein the activating step comprises:

generating a pulse within a predetermined fraction of a time period of the ramp voltage output, the time period of the ramp voltage output being a duration for transition from a minimum value to a maximum value; and providing the pulse to a switching circuit that is capable of making connection between the light source and an external voltage source so as to enable the switching circuit to activate the light source at an instant when the spatial position of the prism has been varied such that the selected one of the chromatic components is registered with the conical focusing region of the lens.

39. The method as claimed in claim 36, wherein the periodic ramp voltage output has a frequency of at least 16 Hz.

40. The method as claimed in claim 23, wherein the light source is a light emitting diode.

41. The method as claimed in claim 23, wherein the light source is a laser diode.

42. A multi-color semiconductor lamp, comprising:

a semiconductor light source activable so as to generate a light output;

a dispersing prism having an input side located in front of said light source to receive the light output, and an output side, said prism separating the light output of said light source into a plurality of chromatic components that radiate at different angles at said output side;

a lens disposed in front of said output side of said prism such that a vertex of a conical focusing region associated with said lens is located at said output side of said prism; and a lamp housing having said light source, said prism and said lens mounted therein;

wherein spatial position of one of said light source and said prism is variable relative to the other one of said light source and said prism.

43. The multi-color semiconductor lamp as claimed in claim 42, wherein said light source is activable when the spatial position of said one of said light source and said prism has been varied such that a selected one of the chromatic components is registered with the conical focusing region of said lens.

* * * * *